(12) United States Patent
Hennessey et al.

(10) Patent No.: US 8,174,154 B2
(45) Date of Patent: May 8, 2012

(54) AIR BUSHING LINEAR STAGE SYSTEM

(75) Inventors: Clement William Hennessey, Golden, CO (US); Nathan Lyons Brown, Littleton, CO (US)

(73) Assignee: ALIO Industries, Inc., Wheat Ridge, CO (US)

( * ) Notice: Subject to any disclaimer, the term of this patent is extended or adjusted under 35 U.S.C. 154(b) by 125 days.

(21) Appl. No.: 12/604,062

(22) Filed: Oct. 22, 2009

(65) Prior Publication Data

US 2010/0096935 A1 Apr. 22, 2010

Related U.S. Application Data

(60) Provisional application No. 61/107,418, filed on Oct. 22, 2008.

(51) Int. Cl.
*H02K 41/02* (2006.01)
(52) U.S. Cl. ...................................... 310/12.06
(58) Field of Classification Search ..... 310/12.01–12.33
See application file for complete search history.

(56) References Cited

U.S. PATENT DOCUMENTS

| | | | |
|---|---|---|---|
| 6,891,601 B2 * | 5/2005 | Jeanne et al. | 355/72 |
| 6,894,449 B2 * | 5/2005 | Nishi | 318/114 |
| 2002/0135240 A1 * | 9/2002 | Sawada et al. | 310/12 |

* cited by examiner

*Primary Examiner* — Nguyen N Hanh (57) ABSTRACT

A linear stage system is provided. The linear stage system includes a base, a carriage plate, a first shaft, a first air bushing coupled to the base, a first motor coupled to the base and the carriage plate, and a first position encoder. The first air bushing is configured to support the carriage plate via the first shaft, wherein the first air bushing utilizes the first shaft as a guide surface and is configured to support positioning of the carriage plate along an axis. The first motor is configured to create a linear motion parallel to the axis in a first motor element coupled to the carriage plate to position the carriage plate along the axis in response to a first control signal. The first position encoder is configured to determine a position of the carriage plate relative to the base.

9 Claims, 13 Drawing Sheets

AIR BUSHING LINEAR STAGE SYSTEM

RELATED APPLICATIONS

This application hereby claims the benefit of and priority to U.S. Provisional Patent Application No. 61/107,418, titled "AIR BUSHING LINEAR STAGE SYSTEM", filed on Oct. 22, 2008, and which is hereby incorporated by reference in its entirety.

TECHNICAL BACKGROUND

Linear stage systems are utilized for precision motion in linear directions. Linear stage systems are commonly used in manufacturing processes, such as semiconductor manufacturing. A linear stage system may be used to position a silicon wafer at a specific position so that a mask image is in focus on the wafer surface. In such photolithography applications focus is critical and is accomplished by ensuring that the surface of the wafer is in a precise position for best possible focus. Other applications for linear stage systems may arise in testing semiconductors where a wafer must be lifted against a set of probes. Once again vertical positioning of the wafer is critical since overdriving the probes may damage them.

One common linear stage system is a Z wedge design used to create motion in the Z, or vertical, direction. Many versions of Z wedge designs exist but this design inherently has many errors associated with it. The motors typically drive in a horizontal dimension and bearings constrain the stage such that motion results in a vertical direction. Bearings always have some dimensional error or parallelism errors that are included in the motion. Additional errors are induced by machining accuracy errors, which are greater than normal for the angular surfaces required of such a design. Often the encoder measures horizontal motion and the results are calculated into the resulting Z motion. This calculation requires assumptions that add to the Z linear accuracy error.

Other Z stage designs use mechanical bearings with encoders and motors oriented vertically. This eliminates some of the errors with the Z wedge design but mechanical bearings still induce errors and are largely dependent on machined surfaces. Additionally stages in this orientation also tend to be large dimensionally in the Z direction.

OVERVIEW

A linear stage system is provided. The linear stage system includes a base, a carriage plate, a first shaft, a first air bushing coupled to the base, a first motor coupled to the base and the carriage plate, and a first position encoder.

The first air bushing is configured to support the carriage plate via the first shaft, wherein the first air bushing utilizes the first shaft as a guide surface and is configured to support positioning of the carriage plate along an axis.

The first motor is configured to create a linear motion parallel to the axis in a first motor element coupled to the carriage plate to position the carriage plate along the axis in response to a first control signal.

The first position encoder is configured to determine a position of the carriage plate relative to the base.

A method for operating a linear stage system is also provided. The linear stage system includes a base, a carriage plate, a first shaft coupled to the carriage plate, a first air bushing coupled to the base, a first motor coupled to the base and the carriage plate, and a first position encoder coupled to the base. The method includes supporting the carriage plate via the first shaft within the first air bushing, wherein the first air bushing utilizes the first shaft as a guide surface and is configured to support positioning of the carriage plate along an axis.

The method also includes with the first motor, creating a linear motion parallel to the axis in a first element coupled to the carriage plate to position the carriage plate along the axis in response to a first control signal, and determining a position of the carriage plate relative to the base using the first position encoder.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

DETAILED DESCRIPTION

A linear stage system comprises multiple air bushings, shafts, encoders, motors, and a controller, which are all mounted on a base. The air bushings support a carriage plate. The linear stage system may also comprise pneumatic counter balances to permit easy user adjustment for various applications and a central thru aperture that provides an added capability for additional equipment mounted to the base. The motors, air bushings, and counter balances are all placed symmetrically within the structure to ensure all applied forces and restraint are balanced. Other embodiments may include placing the motors, air bushing, and counter balances asymmetrically within the structure. Depending on how the linear stage system is configured, the carriage plate may move in different linear dimensions from the base.

Figure 1:
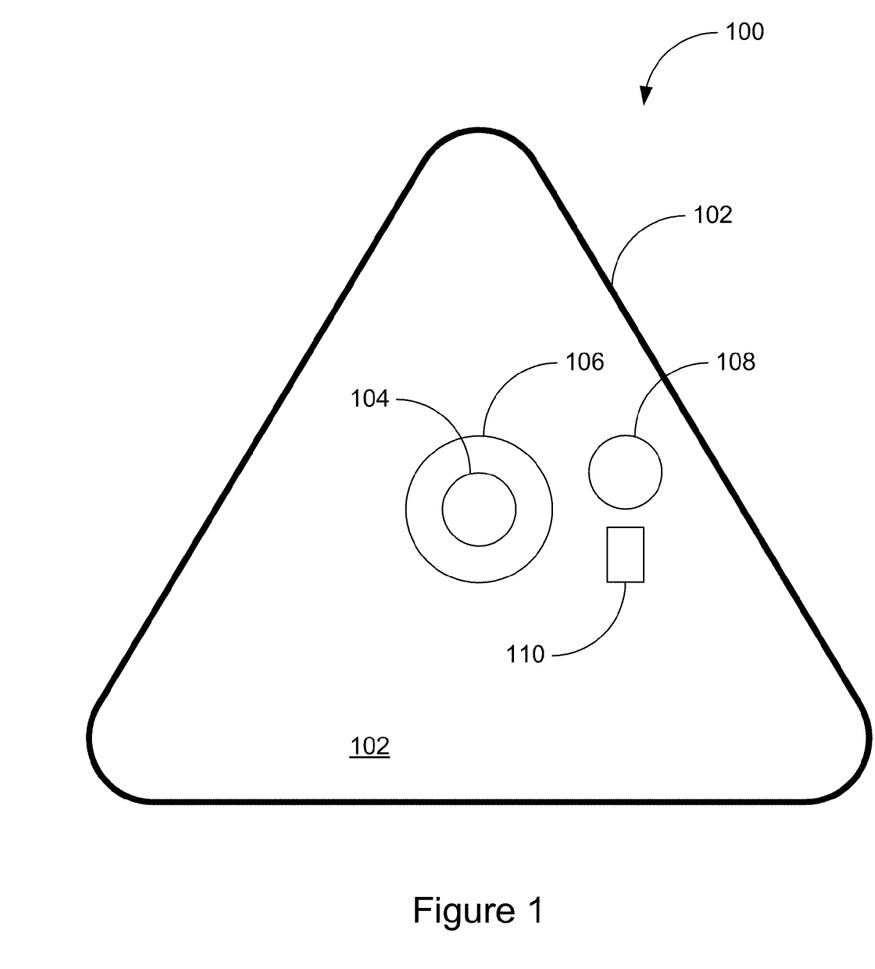
FIG. 1 is a top view of an example of a linear stage.

FIG. 1 is a top view of an example of a linear stage 100. The linear stage 100 of FIG. 1 is triangular in shape and is comprised of a stationary base (not shown beneath carriage plate 102) and a top moving carriage plate 102. While the linear stage system of FIG. 1 is triangular in shape, other shapes and configurations may be used. This example linear stage 100 includes a single air bushing 106 located near the center of the linear stage 100, and air bushing 106 encloses shaft 104. Air bushing 106 is permanently fixed to the stationary base to ensure system performance and repeatability over time. Air bushing 106 is used to constrain carriage plate 102 and to allow motion along the air bushing guide shaft.

Shaft 104 is used as an air bushing guide surface and can be manufactured to very high precision which allows for a precise straightness of motion. Additionally, the high precision allows for the pitch, yaw, and roll errors of the linear stage to be very small. In this example illustration, motion of carriage plate 102 would be in or out of the page.

The linear stage 100 of FIG. 1 also includes motor 108 and position encoder 110, however any number of motors and position encoders may be used in other embodiments. Motor 108 is a linear actuator, and in this example, a voice coil and a moving element is used for motor 108, while other linear actuators may be used for motor 108 in other embodiments. In this example embodiment, the voice coil is coupled to the base while the moving element is coupled to carriage plate 102. When electrical signals are applied to the voice coil, the element is moved up or down along the voice coil. Thus, the voice coil creates a linear motion parallel to the axis of motion of the carriage plate with respect to the base.

The voice coil provides positional accuracy on a nanometer level with minimal dither and no backlash. The voice coil allows for speeds that range from less than one micrometer per second to several meters per second (depending on motor size selection). Additionally, the voice coil is a non-contact device that does not add any friction or error into the system.

Position encoder 110 provides for high resolution digital output. The encoder scales may be made with Invar® to reduce positional error due to thermal expansion or environmental effects. The encoder design also accommodates Zerodur® or glass scales with zero thermal expansion. Two or three encoders may paired with each motor and located adjacent to the respective motor in some embodiments. The use of multiple encoders per motor allows for accurate feedback, which in turn results in accurate positioning capability as well as no angular errors of the carriage plate during motion or holding position. Additionally, position encoders 110 may be used to determine the position of carriage plate 102 with respect to the base in other configurations.

Figure 5:
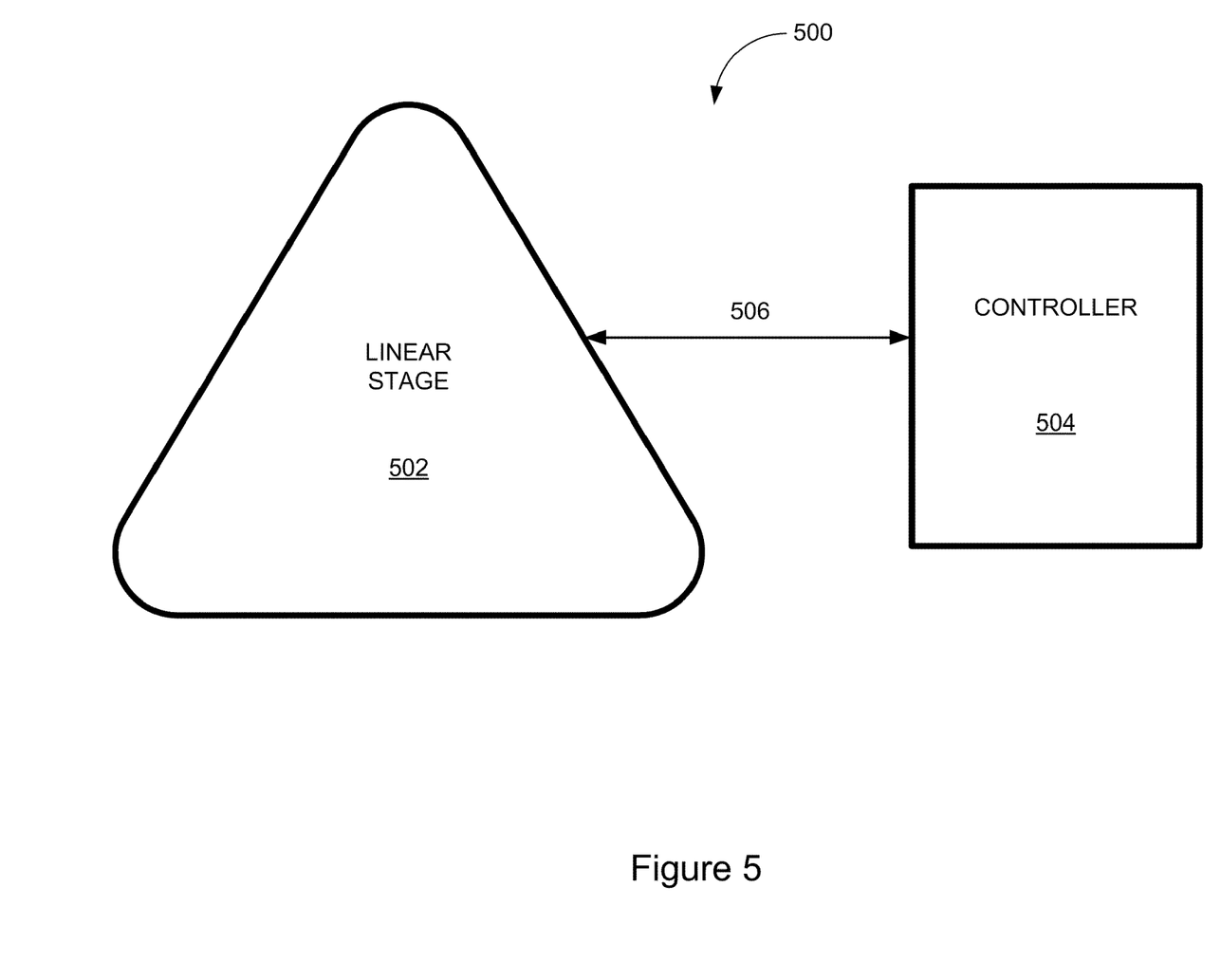
FIG. 5 is a block diagram of an example of a linear stage system.

The linear stage system of FIG. 1 is controlled by a stand-alone controller (illustrated in FIG. 5). The controller communicates with a computer through a RS-232 serial port, an Ethernet, or a USB connection. The controller communicates with the linear stage using component signals. The controller can be used to monitor the air bushing supply pressure for sufficient pressure. The controller has two to three channels of motion control for the different motor/encoder pairs.

Figure 2:
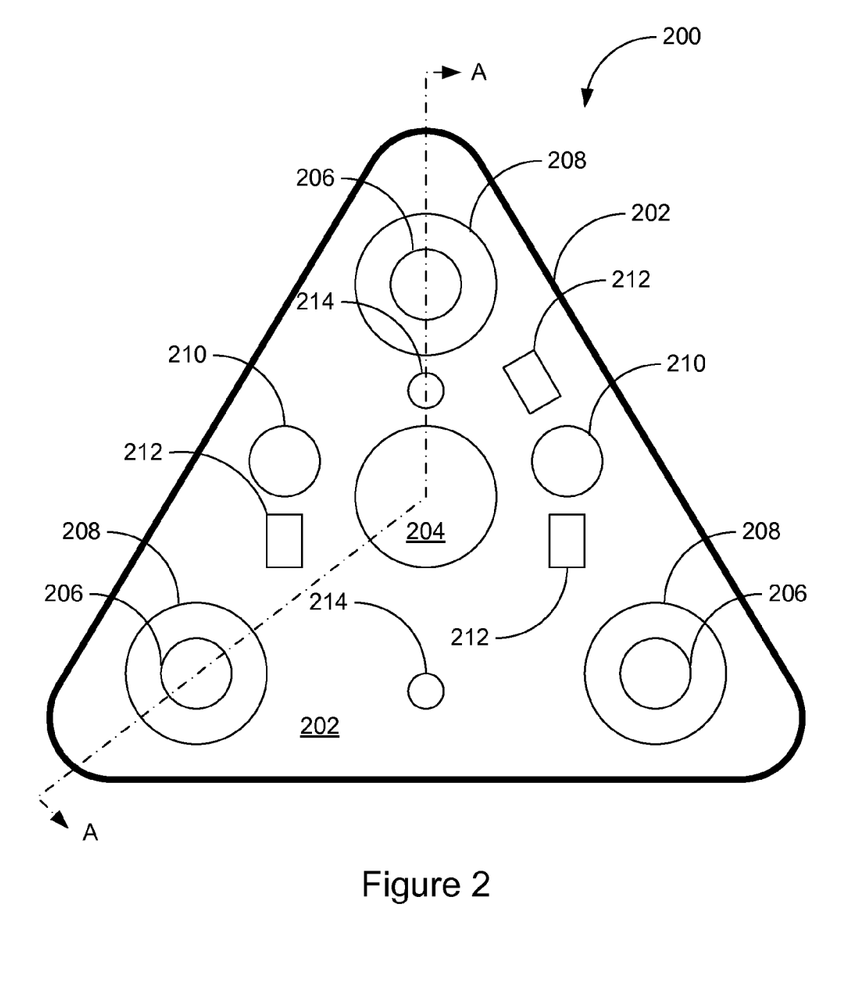
FIG. 2 is a top view of an example of a linear stage.

FIG. 2 is a top view of an example of a linear stage 200. The linear stage 200 of FIG. 2 is triangular in shape and is comprised of a stationary base (not shown beneath carriage plate 202) and a top moving carriage plate 202. While the linear stage 200 of FIG. 2 is triangular in shape, other shapes and configurations may be used. A thru aperture 204 is found at the center of the linear stage system and passes through the base and the carriage plate 202. The linear stage 200 has air bushings 208 located near each corner and each air bushing 208 surrounds a shaft 206. Air bushings 208 are permanently fixed to the base to ensure system performance and repeatability over time. The air bushings 208 are used to constrain the carriage plate 202 and allow motion along the air bushing guide shafts. There are three air bushings 208 for kinematic support and constraint of the moving carriage plate 202. The shafts 206 are used as the air bushing guide surfaces and can be manufactured to very high precision, which allows for a precise straightness of motion. Additionally, the high precision allows for the pitch, yaw, and roll errors of the linear stage to be very small.

The linear stage 200 of FIG. 2 also contains two voice coils 210 and two counterbalances 214, however, more than two voice coils 210 and two counterbalances 214 may be used. The voice coils 210 provide positional accuracy on a nanometer level with minimal dither and no backlash. While voice coils 210 are used as motors in the linear stage system of FIG. 1, other linear actuators can be used. The counterbalances 214 support the payload and moving mass with the motors providing the driving force for motion. The voice coils 210 allow for speeds that range from less than one micrometer per second to several meters per second (depending on motor size selection). Additionally, the voice coils 210 are non-contact devices that do not add any friction or error into the system. Multiple voice coils 210 are used to ensure force is applied evenly over the entire carriage plate 202.

Additionally, the linear stage 200 of FIG. 2 contains three encoders 212, although, more or fewer encoders 212 could be used. The encoders 212 provide for high resolution digital output. The encoder scales may be made with Invar® to reduce positional error due to thermal expansion or environmental effects. The encoder design also accommodates Zerodur® or glass scales with zero thermal expansion. Two or three encoders 212 may be paired with each separate motor 210 and located adjacent to the respective motor. The use of multiple encoders 212 per motor 210 allows for accurate feedback, which in turn results in accurate positioning capability as well as no angular errors of the carriage plate 202 during motion or holding position.

The linear stage 200 of FIG. 2 is controlled by a stand-alone controller (illustrated in FIG. 5). The controller communicates through a RS-232 serial port, an Ethernet, or a USB connection. The controller can be used to monitor the air bushing supply pressure for sufficient pressure. The controller has two to three channels of motion control for the different motor/encoder pairs.

Figure 3:
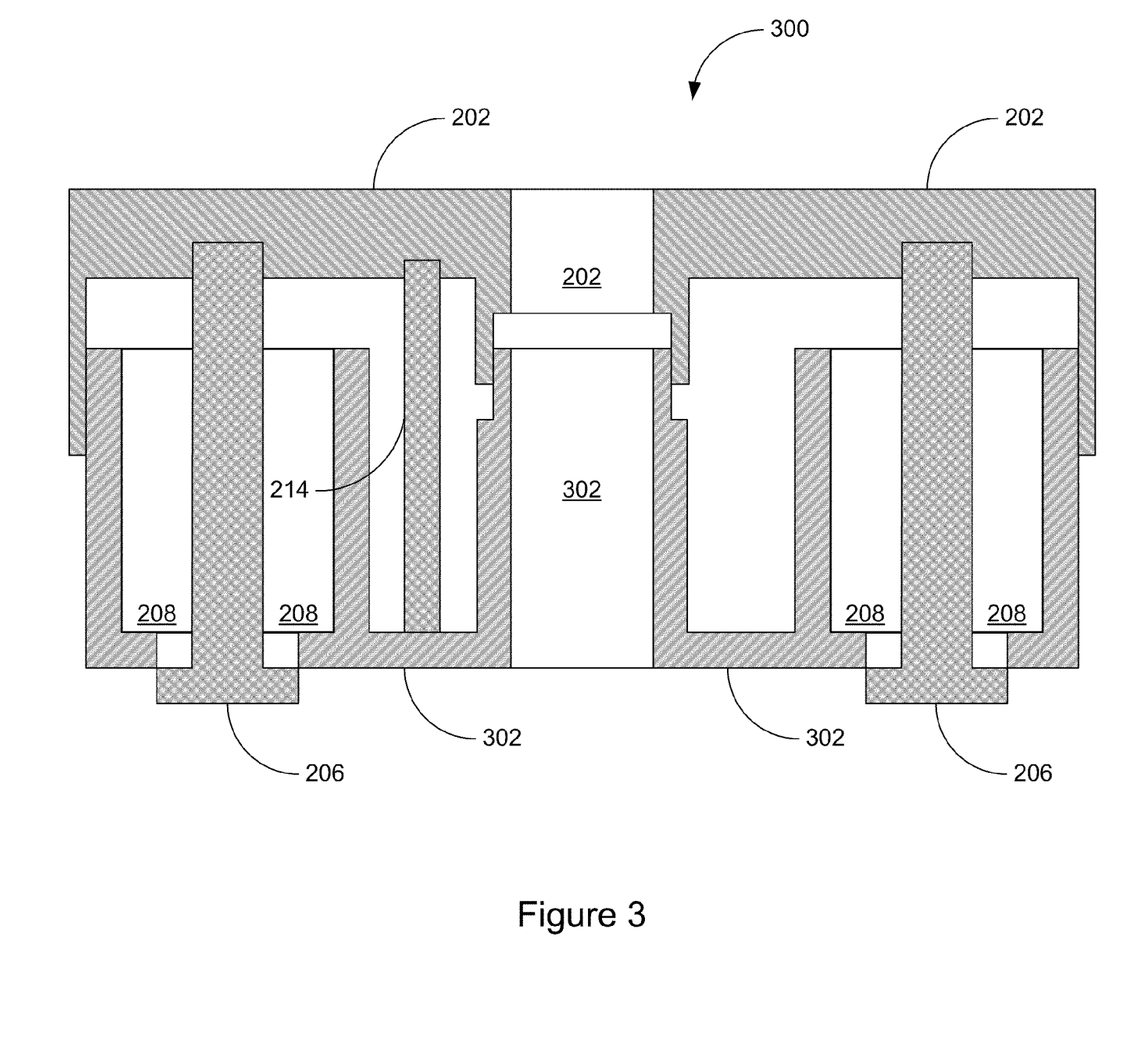
FIG. 3 is a cross sectional view of the air bushings and shafts in an example of a linear stage.

FIG. 3 is a cross sectional view of the air bushings and shafts in an example of a linear stage. FIG. 3 is an illustration of cross-section A-A from FIG. 2. FIG. 3 illustrates an example of the positioning of the air bushings 208 and shafts 206 relative to each other. In FIG. 3, the shafts 206 move up and down while the air bushings 208 are affixed to the base 302. Such a configuration of a Z motion may provide better than 100 nm of accuracy and better than 90 nm of repeatability, and better than 10 nm of resolution.

In this example, two air bushings 208 and two shafts 206 are illustrated within linear stage 300. Linear stage 300 includes stationary base 302 and moving carriage plate 202. The two air bushings 208 are coupled to base 302, and the two shafts are coupled to carriage plate 202, and configured to move along one axis within the two air bushings 208. Counter balance 214 is also illustrated as coupled with carriage plate 202 and touching base 302. Counter balance 214 supports the payload and moving mass against gravity with the motors providing the driving force for motion.

Figure 4:
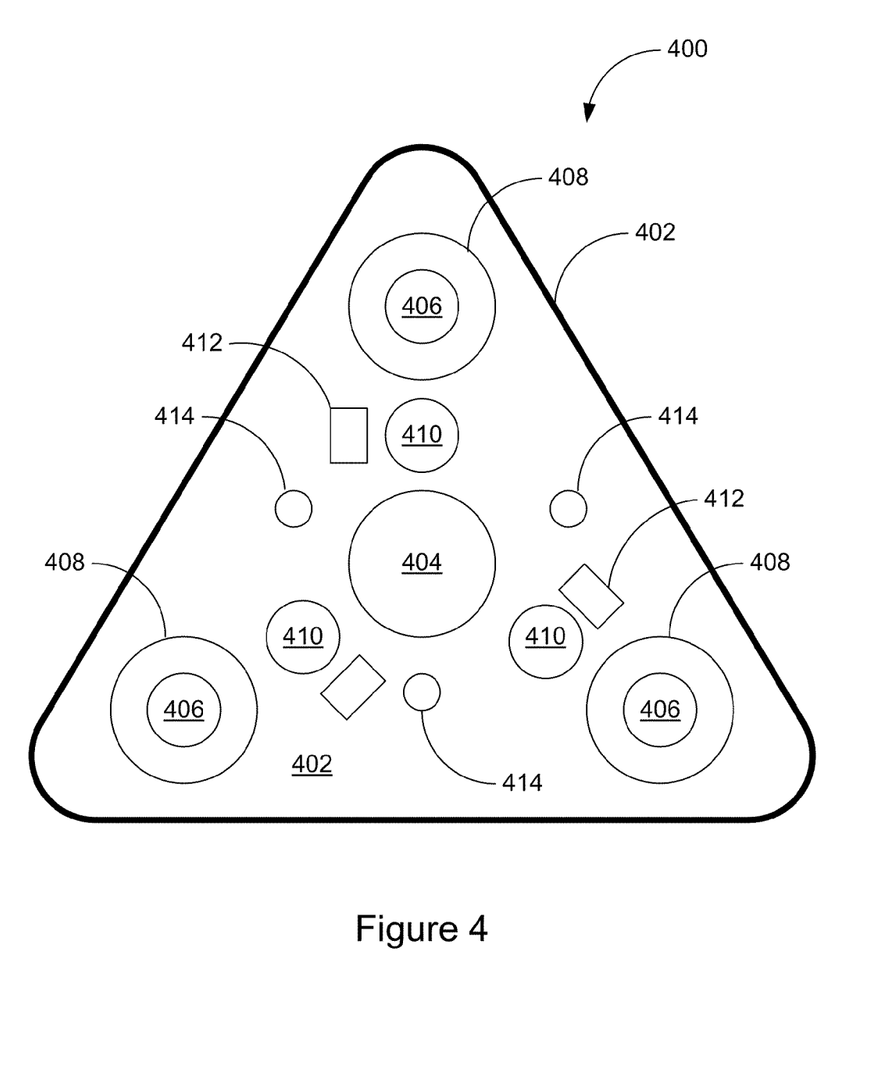
FIG. 4 is a top view of an example of a linear stage.

FIG. 4 is a top view of an example of a linear stage 400. Linear stage 400 illustrated in FIG. 4 is similar to linear stage 300 illustrated in FIG. 3 with the exception of the addition of another motor/encoder pair and another counterweight. Also, positions of some of the elements of linear stage 400 are different. In this example, linear stage 400 includes carriage plate 402, three air bushings 408 with their associated shafts 406, three motors 410 with their associated position encoders 412. Also shown are three counterweights 414.

FIG. 5 is a block diagram of an example of a linear stage system 500. This example linear stage system includes linear stage 502 and controller 504. Controller 504 communicates with a controlling computer through a RS-232 serial port, an Ethernet, or a USB connection 506. The controller communicates with the linear stage using component signals. Controller 504 can be used to monitor the air bushing supply pressure for sufficient pressure. Controller 504 has two to three channels of motion control for the different motor/encoder pairs.

Figure 6:
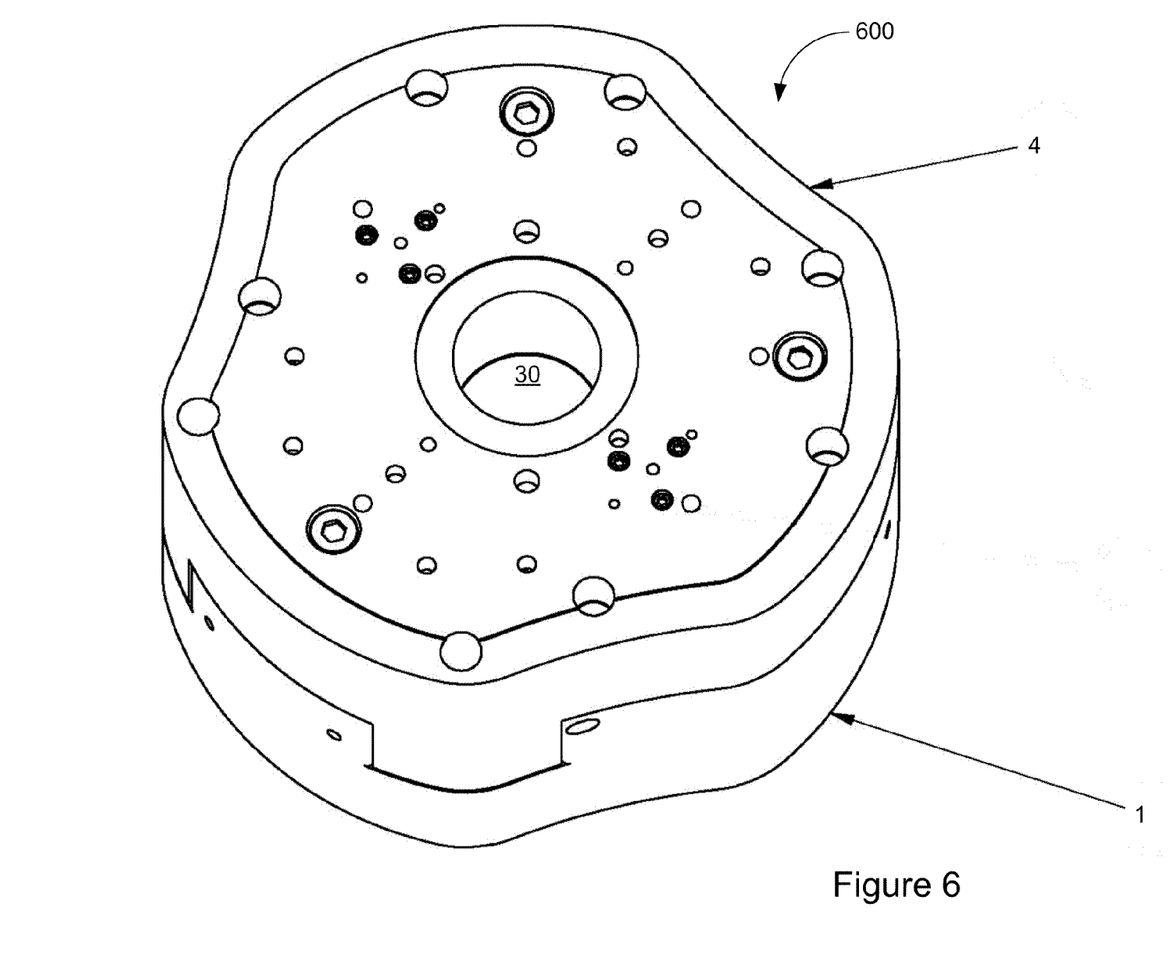
FIG. 6 is a perspective view of an example of a linear stage.

FIG. 6 is a perspective view of an example of a linear stage 600. This example linear stage 600 includes stationary base 1 and moveable carriage plate 4. A thru aperture 30 is also shown in the center of linear stage 600 going through both carriage plate 4 and base 1.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

The linear stage 600 of FIG. 6 also includes at least one motor and at least one position encoder, however any number of motors and position encoders may be used in other embodiments. The motor is a linear actuator, and in this example, a voice coil and a moving element is used as a motor, while other linear actuators may be used as a motor in other embodiments. In this example embodiment, the voice coil is coupled to the base 1 while the moving element is coupled to carriage plate 4. When electrical signals are applied to the voice coil, the element is moved up or down along the voice coil. Thus, the voice coil creates a linear motion parallel to the axis of motion of the carriage plate with respect to the base.

The voice coil provides positional accuracy on a nanometer level with minimal dither and no backlash. The voice coil allows for speeds that range from less than one micrometer per second to several meters per second (depending on motor size selection). Additionally, the voice coil is a non-contact device that does not add any friction or error into the system.

Position encoders provide for high resolution digital output. The encoder scales may be made with Invar® to reduce positional error due to thermal expansion or environmental effects. The encoder design also accommodates Zerodur® or glass scales with zero thermal expansion. Two or three encoders may paired with each motor and located adjacent to the respective motor in some embodiments. The use of multiple encoders per motor allows for accurate feedback, which in turn results in accurate positioning capability as well as no angular errors of the carriage plate during motion or holding position. Additionally, position encoders may be used to determine the position of carriage plate 4 with respect to base 1 in other configurations.

The linear stage 600 of FIG. 6 is controlled by a stand-alone controller (illustrated in FIG. 5). The controller communicates through a RS-232 serial port, an Ethernet, or a USB connection. The controller can be used to monitor the air bushing supply pressure for sufficient pressure. The controller has two to three channels of motion control for the different motor/encoder pairs.

Figure 7:
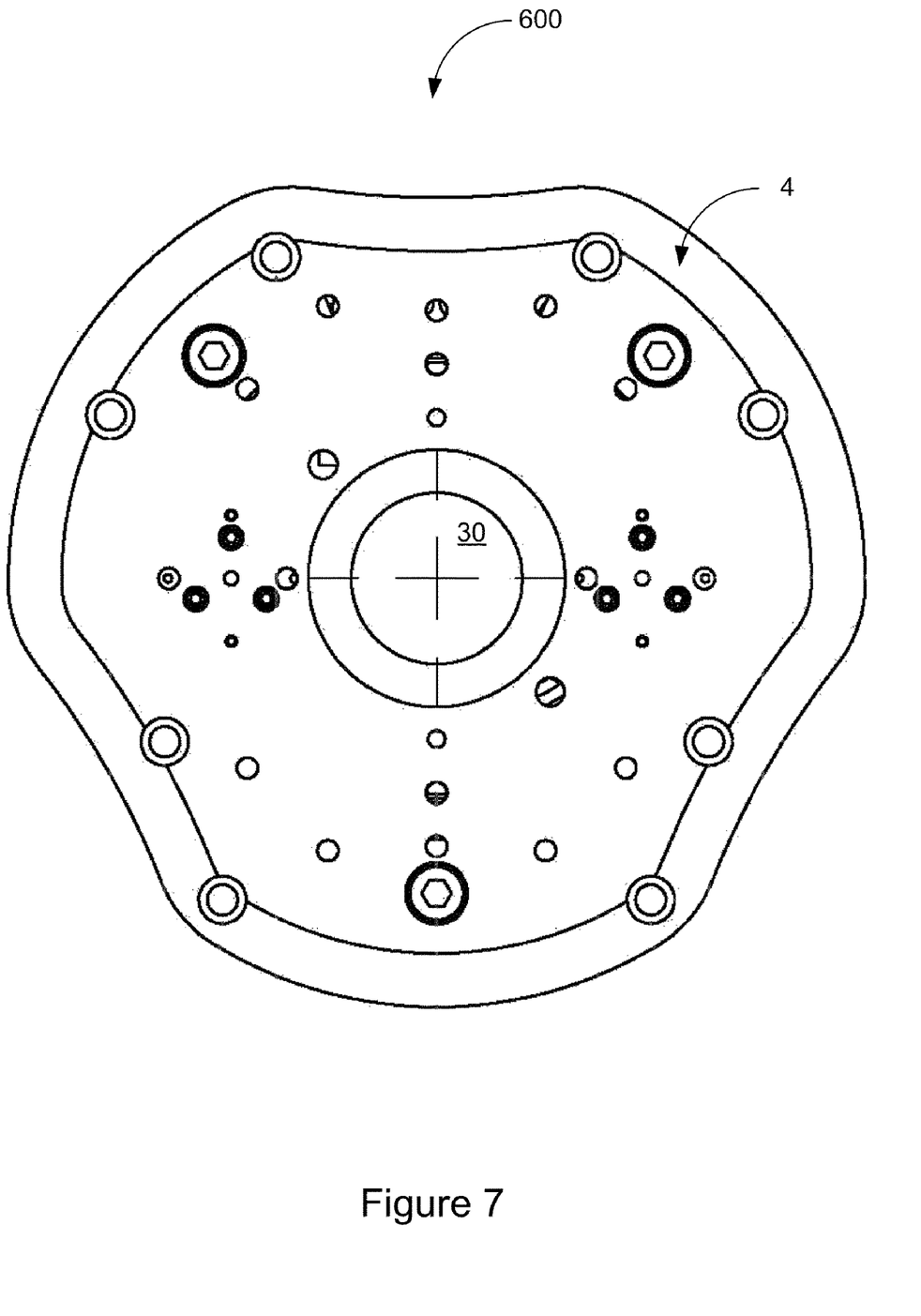
FIG. 7 is a top view of an example of a carriage plate for a linear stage.

FIG. 7 is a top view of an example of a carriage plate 4 for a linear stage 600. This example carriage plate 4 includes a number of apertures and bolts used for attaching internal elements of linear stage 600 to carriage plate 4. Other embodiments may use other configurations and other means for coupling of elements to carriage plate 4. A thru aperture 30 is also shown in the center of linear stage 600 going through carriage plate 4.

Figure 8A:
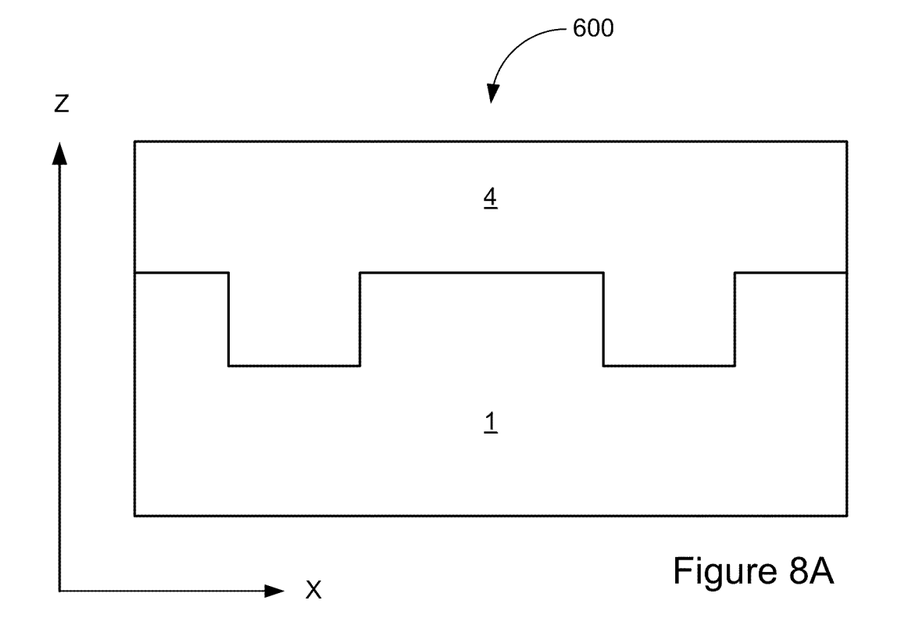
FIGS. 8A and 8B are side views of an example of a linear stage.
Figure 8B:
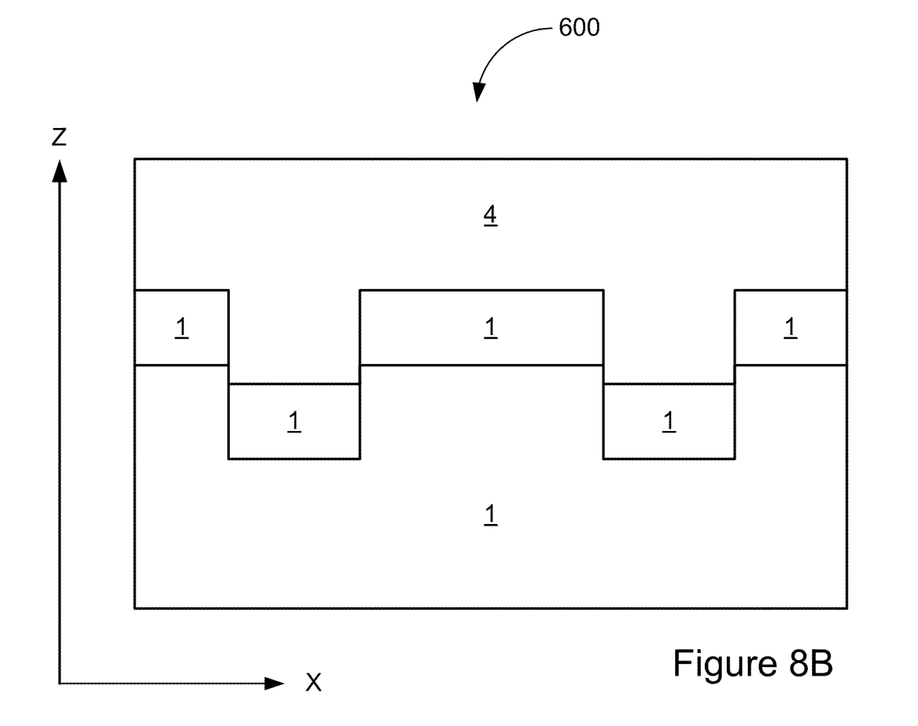

FIGS. 8A and 8B are side views of an example of a linear stage 600. FIG. 8A illustrates linear stage 600 in a lowered or closed position. In this position, carriage plate 4 is at its lowest elevation and rests against base 1. FIG. 8B illustrates linear stage 600 is a fully risen or open position. In this position carriage plate 4 is at its highest elevation. Note that carriage plate 4 moves in the Z axis, in the same direction as the motors move. In some embodiments, linear stage 600 may be rotated such that the motion occurs on a different axis. However, the motion of carriage plate 4 will always be along an axis parallel to the motion of the one or more motors or voice coils and moveable elements used in constructing linear stage 600.

Figure 9:
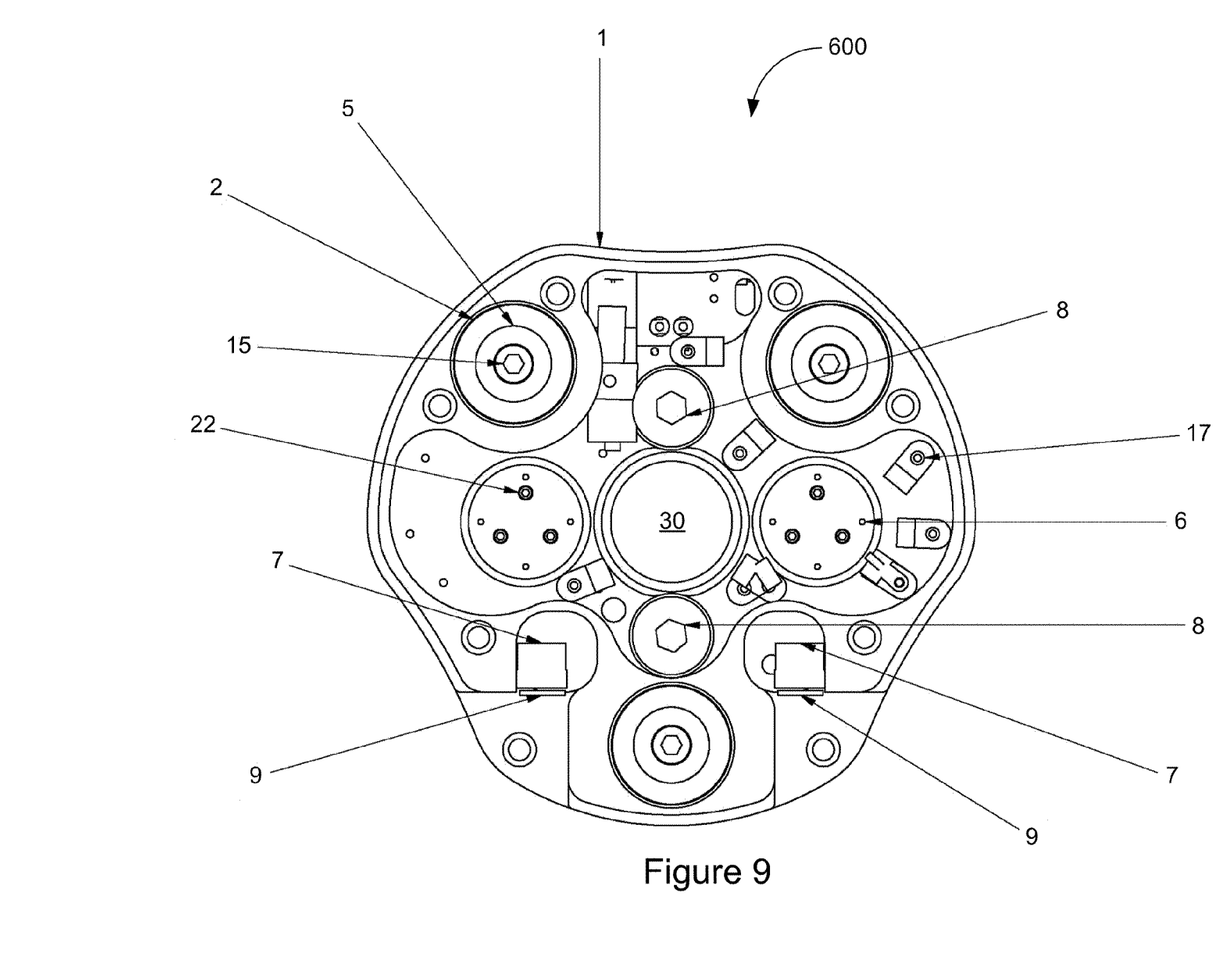
FIG. 9 is a top view of an example of a base for a linear stage.

FIG. 9 is a top view of an example embodiment of a base for a linear stage 600. In this example embodiment stationary base 1 is illustrated with a number of its associated elements. This example assembly includes three air bushings 2, three shafts 5 each with a socket head cap 15. Also included are two actuators used as counterbalances 8, loop straps 17 used to route tubing to the air bushings 2. Two voice coils 6 with their assembly screws 22 are illustrated along with two position encoder heads 7 and their respective scales 9. A thru aperture 30 is also shown in the center of linear stage 600 going through base 1.

Figure 10:
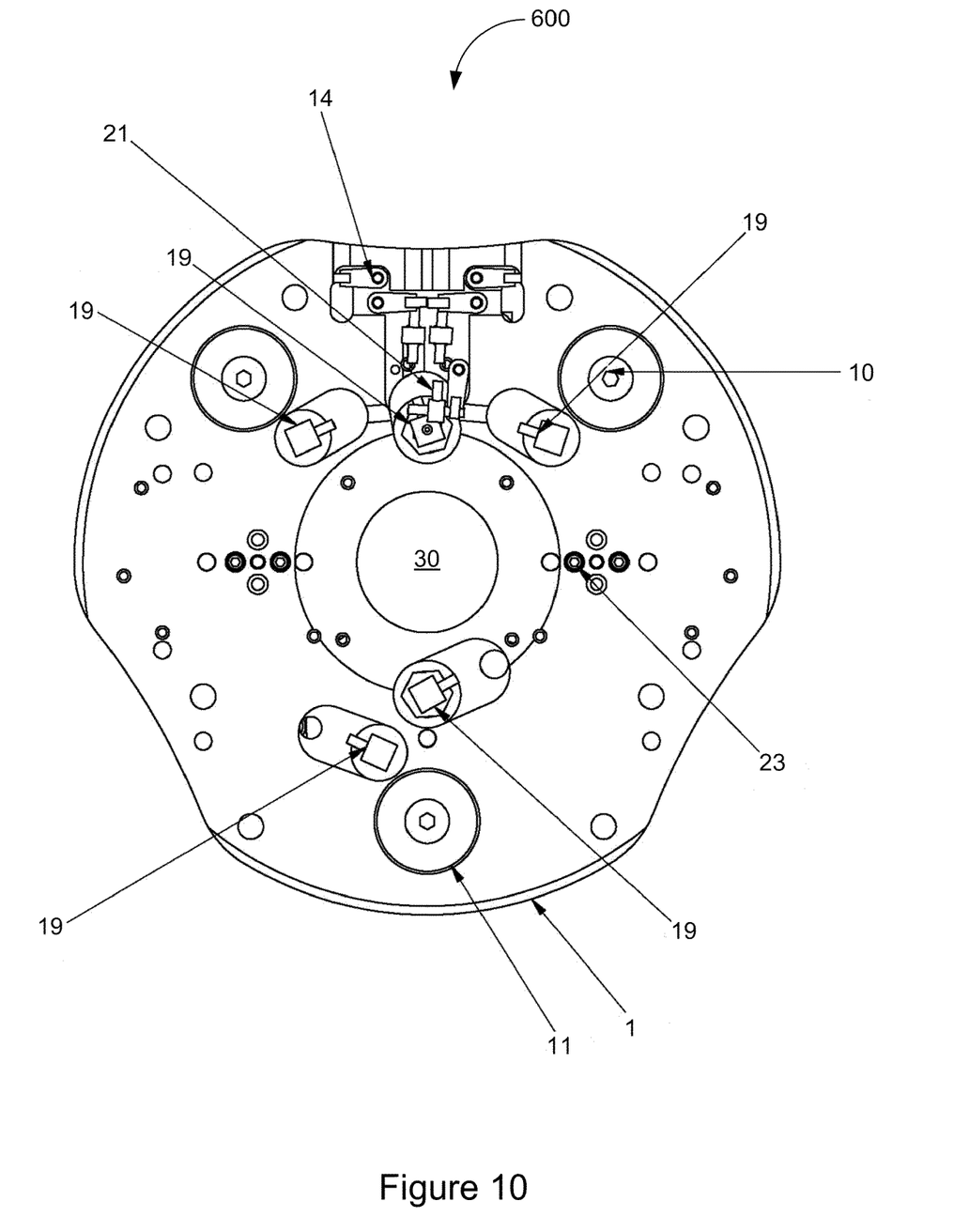
FIG. 10 is a bottom view of an example of a base for a linear stage.

FIG. 10 is a bottom view of an example of a base for a linear stage 600. This view illustrates the various fittings and connections present on the bottom of the base 1 of linear stage 600. These fittings include a plurality of pneumatic fittings 19 used for supplying air to their associated air bushings, along with three hard stops 11 affixed to their respective shafts by screws 10. These hard stops 11 constrain the maximum motion along the Z axis that the carriage plate is allowed to move. Other embodiments may use other methods of limiting the travel of the carriage plate. Also illustrated are a plurality of screw holes 14, and screws 23 for affixing the motors to the base. Other embodiments may use other configurations and means for connecting supply hoses and wires to linear stage 600, FIG. 10 is simply used for the illustration of one possible embodiment. A thru aperture 30 is also shown in the center of linear stage 600 going through base 1.

Figure 11:
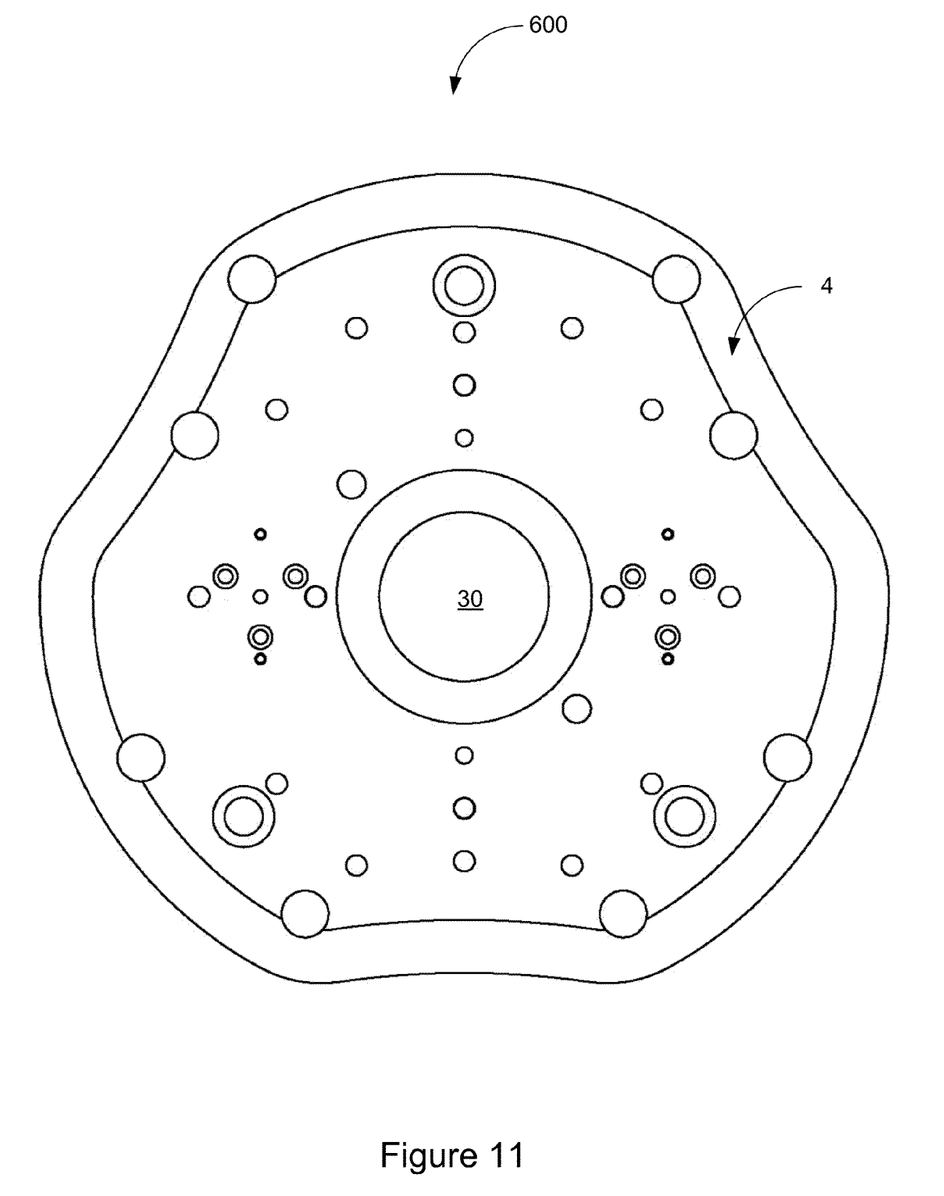
FIG. 11 is a top view of an example of a carriage plate for a linear stage.

FIG. 11 is a top view of an example of a carriage plate 4 for a linear stage 600. In this example, carriage plate 4 includes a number of features used for connecting various elements of linear stage 600 to carriage plate 4. A thru aperture 30 is also shown in the center of linear stage 600 going through carriage plate 4. Other embodiments may use other configurations for connecting these various elements to carriage plate 4, FIG. 11 is simply used for the illustration of one possible embodiment.

Figure 12:
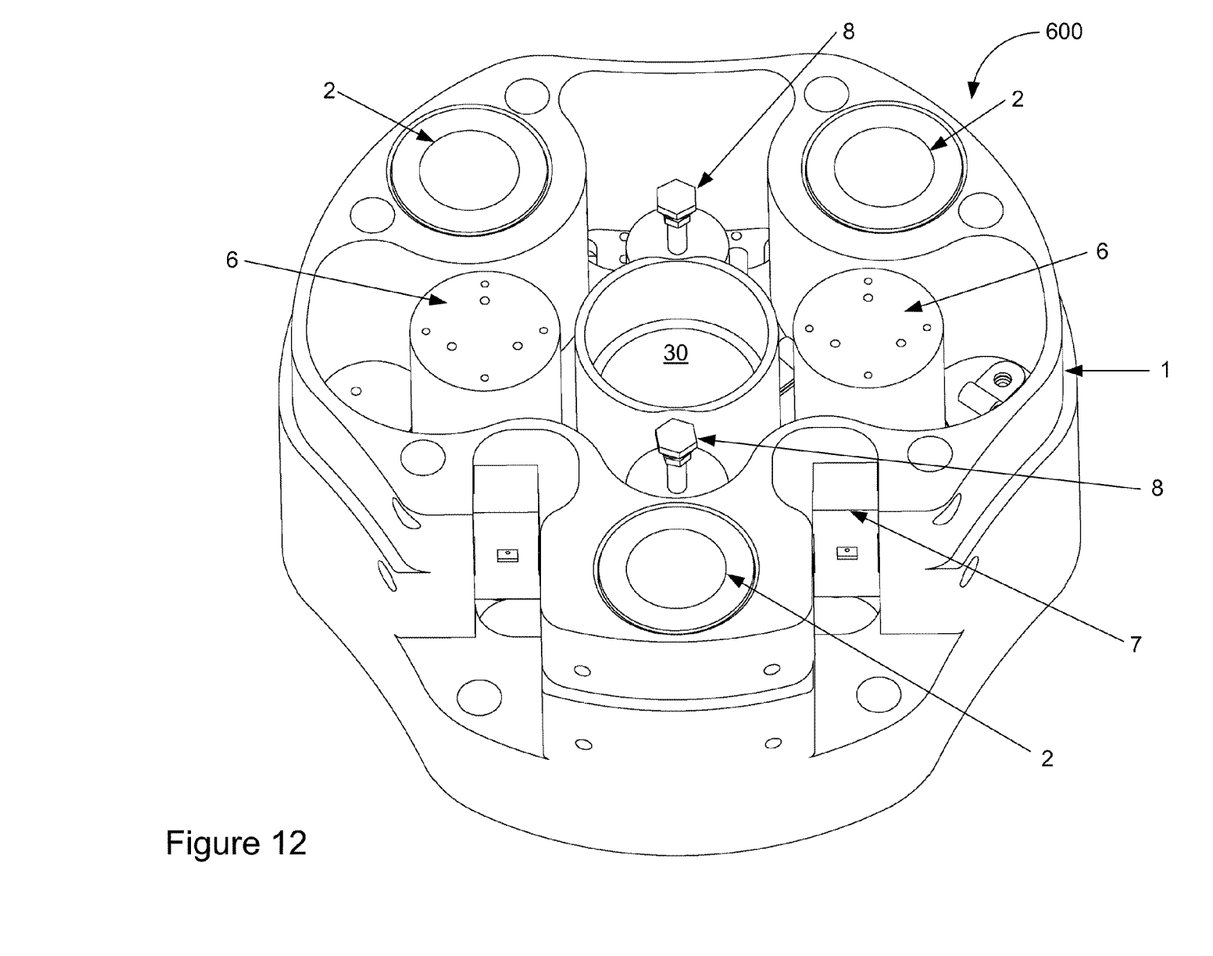
FIG. 12 is a perspective view of an example of a base for a linear stage.

FIG. 12 is a perspective view of an example of a base 1 for a linear stage 600. In this example embodiment, base 1 includes a number of elements of linear stage 600. Base 1 includes three air bushings 2, two actuators used as counterbalances 8, two motors or voice coils 6, along with two encoders 7. A thru aperture 30 is also shown in the center of linear stage 600 going through base 1.

Base 1 of linear stage 600 of FIG. 12 includes two motors and two position encoders, however any number of motors and position encoders may be used in other embodiments.

The motor is a linear actuator, and in this example, a voice coil and a moving element is used as a motor, while other linear actuators may be used as a motor in other embodiments. In this example embodiment, the voice coil is coupled to the base 1 while the moving element is coupled to carriage plate 4. When electrical signals are applied to the voice coil, the element is moved up or down along the voice coil. Thus, the voice coil creates a linear motion parallel to the axis of motion of the carriage plate with respect to the base.

The voice coil provides positional accuracy on a nanometer level with minimal dither and no backlash. The voice coil allows for speeds that range from less than one micrometer per second to several meters per second (depending on motor size selection). Additionally, the voice coil is a non-contact device that does not add any friction or error into the system.

Position encoders provide for high resolution digital output. The encoder scales may be made with Invar® to reduce positional error due to thermal expansion or environmental effects. The encoder design also accommodates Zerodur® or glass scales with zero thermal expansion. Two or three encoders may paired with each motor and located adjacent to the respective motor in some embodiments. The use of multiple encoders per motor allows for accurate feedback, which in turn results in accurate positioning capability as well as no angular errors of the carriage plate during motion or holding position. Additionally, position encoders may be used to determine the position of carriage plate 4 with respect to base 1 in other configurations.

The linear stage 600 of FIG. 12 is controlled by a stand-alone controller (illustrated in FIG. 5). The controller communicates through a RS-232 serial port, an Ethernet, or a USB connection. The controller can be used to monitor the air bushing supply pressure for sufficient pressure. The controller has two to three channels of motion control for the different motor/encoder pairs.

Other embodiments may use other configurations and different quantities of elements in constructing linear stage 600. FIG. 12 is simply used for the illustration of one possible embodiment.

Figure 13:
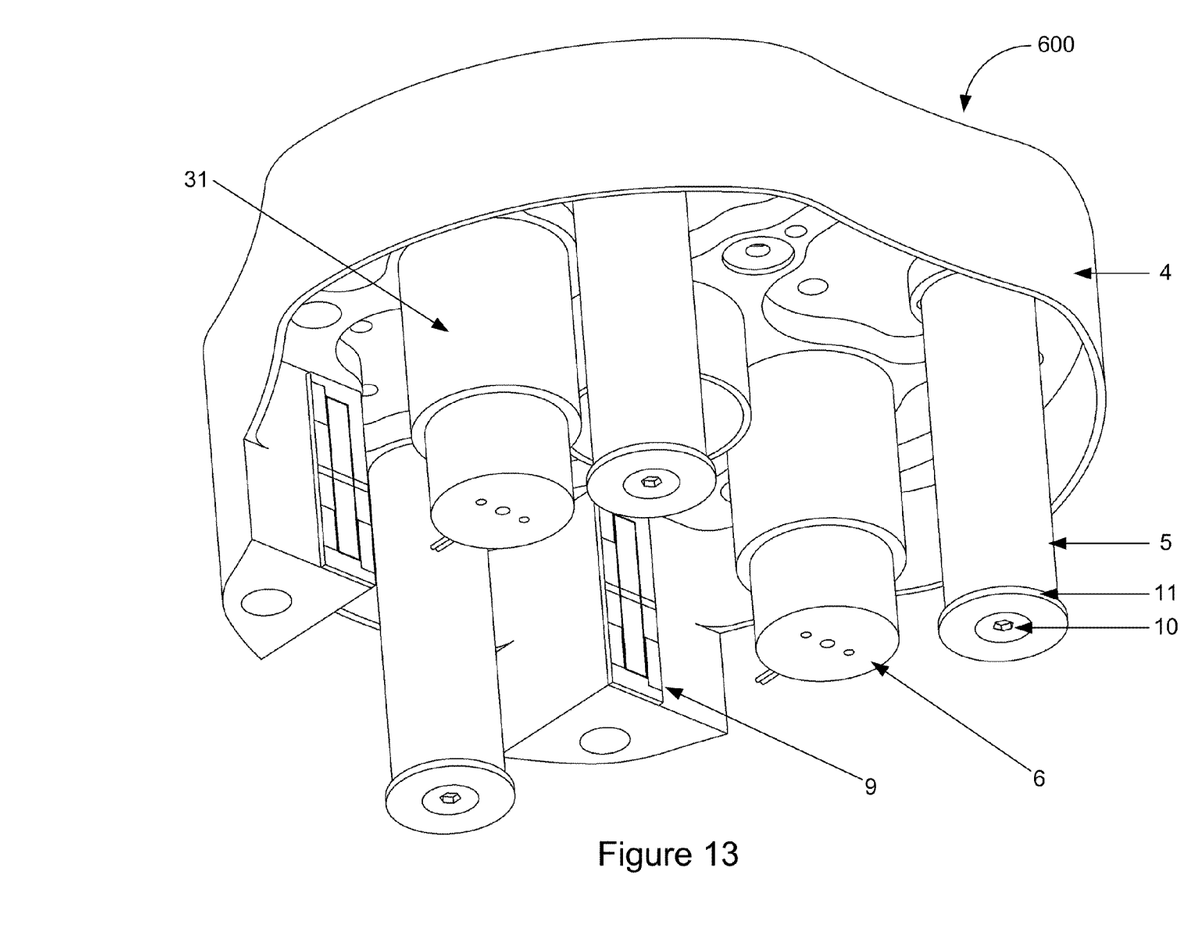
FIG. 13 is a perspective view of an example of a carriage plate for a linear stage.

FIG. 13 is a perspective view of an example of a carriage plate 4 for a linear stage 600. In this example embodiment, carriage plate 4 includes a number of elements of linear stage 600. Carriage plate 4 includes three shafts 5, each with a corresponding hard stop 11 attached to their respective shafts by screws 10, along with two motors or voice coils 6 and two encoder scales 9. In this embodiment, travel of the carriage plate 4 with respect to base 1 is limited by hard stops 11. However, other embodiments may use other structures or means for limiting the travel of carriage plate 4. Each voice coil 6 is associated with a moveable element 31 affixed to carriage plate 4, shown here as a cylindrical sleeve around the voice coil. When electricity is applied to a voice coil 6, the moveable element 31 moves along the axis of the voice coil. In other words, the motion of the motor is parallel to the axis of the motion of the carriage plate.

Carriage plate 4 of linear stage 600 of FIG. 13 includes two motors and two position encoders, however any number of motors and position encoders may be used in other embodiments. The motor is a linear actuator, and in this example, a voice coil 6 and a moving element 31 is used as a motor, while other linear actuators may be used as a motor in other embodiments. In this example embodiment, during assembly the voice coil 6 is coupled to the base 1 while the moving element 31 is coupled to carriage plate 4. When electrical signals are applied to the voice coil 6, the element 31 is moved up or down along the voice coil 6 along the Z axis. Thus, the voice coil creates a linear motion parallel to the axis of motion of the carriage plate with respect to the base.

The voice coil provides positional accuracy on a nanometer level with minimal dither and no backlash. The voice coil allows for speeds that range from less than one micrometer per second to several meters per second (depending on motor size selection). Additionally, the voice coil is a non-contact device that does not add any friction or error into the system.

Position encoders provide for high resolution digital output. The encoder scales may be made with Invar® to reduce positional error due to thermal expansion or environmental effects. The encoder design also accommodates Zerodur® or glass scales with zero thermal expansion. Two or three encoders may paired with each motor and located adjacent to the respective motor in some embodiments. The use of multiple encoders per motor allows for accurate feedback, which in turn results in accurate positioning capability as well as no angular errors of the carriage plate during motion or holding position. Additionally, position encoders may be used to determine the position of carriage plate 4 with respect to base 1 in other configurations.

The linear stage 600 of FIG. 13 is controlled by a stand-alone controller (illustrated in FIG. 5). The controller communicates through a RS-232 serial port, an Ethernet, or a USB connection. The controller can be used to monitor the air bushing supply pressure for sufficient pressure. The controller has two to three channels of motion control for the different motor/encoder pairs.

Also, other embodiments may differ in configuration and quantity of elements used in constructing linear stage 600. FIG. 13 is simply used for the illustration of one possible embodiment.

It should be emphasized that the above-described embodiments are merely possible examples of implementations, merely set forth for a clear understanding of the principles of this disclosure. Many variations and modifications may be made to the above-described embodiments without departing substantially from the principles of the disclosure. All such modifications and variations are intended to be included herein within the scope of this disclosure.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A linear stage system, comprising:
   a base;
   a carriage plate;
   a first shaft;
   a first air bushing coupled to the base, configured to support the carriage plate via the first shaft, and to constrain motion of the carriage plate to an axis of the first shaft, wherein the first air bushing utilizes the first shaft as a guide surface and is configured to support positioning of the carriage plate along the axis of the first shaft;
   a first motor coupled to the base, comprising a first motor element coupled to the carriage plate, and configured to create a linear motion parallel to the axis of the first shaft in the first motor element to position the carriage plate along the axis of the first shaft in response to a first control signal; and a first position encoder, configured to determine a position of the carriage plate relative to the base.

2. The linear stage system of claim 1, further comprising a second position encoder, configured to determine a position of the first motor relative to the carriage plate.

3. The linear stage system of claim 1, further comprising:
a second shaft;
a second air bushing coupled to the base, configured to support the carriage plate via the second shaft, and to constrain motion of the carriage plate to an axis of the second shaft parallel to the axis of the first shaft, wherein the second air bushing utilizes the second shaft as a guide surface and is configured to support positioning of the carriage plate along the axis of the second shaft;
a second motor coupled to the base, comprising a second motor element coupled to the carriage plate, and configured to create a linear motion parallel to the axis of the second shaft in the second motor element to position the carriage plate along the axis of the second shaft in response to a second control signal; and
a second position encoder, configured to determine a position of the carriage plate relative to the base.

4. The linear stage system of claim 3, further comprising:
a third shaft; and
a third air bushing coupled to the base, configured to support the carriage plate via the third shaft, and to constrain motion of the carriage plate to an axis of the third shaft parallel to the axis of the first shaft, wherein the third air bushing utilizes the third shaft as a guide surface and is configured to support positioning of the carriage plate along the axis of the third shaft.

5. The linear stage system of claim 4, further comprising:
a third motor coupled to the base, comprising a third motor element coupled to the carriage plate, and configured to create a linear motion parallel to the axis of the third shaft in the third motor element to position the carriage plate along the axis of the third shaft in response to a third control signal; and
a third position encoder, configured to determine a position of the carriage plate relative to the base.

6. The linear stage system of claim 1, further comprising:
a controller, electrically coupled to the first motor and the first position encoder, configured to:
receive position data from the first position encoder; and
transmit the first control signal to the first motor.

7. The linear stage system of claim 1, further comprising a counterbalance coupled to the carriage plate.

8. The linear stage system of claim 1, further comprising a thru aperture through the base and the carriage plate.

9. The linear stage system of claim 1, wherein the first motor comprises a voice coil and the first motor element.

* * * * *